United States Patent [19]
Mitsuoka et al.

[11] Patent Number: 5,639,547
[45] Date of Patent: Jun. 17, 1997

[54] MAGNETIC HEADS AND MAGNETIC RECORDING REPRODUCING DEVICES USING MAGNETIC LAMINATIONS

[75] Inventors: Katsuya Mitsuoka, Hitachi; Yutaka Sugita, Tokorozawa, both of Japan; Hideo Fujiwara, Tuscaloosa, Ala.

[73] Assignees: Hitachi Maxell, Ltd., Osaka; Hitachi Ltd., Tokyo, both of Japan

[21] Appl. No.: 44,486

[22] Filed: Apr. 9, 1993

[30] Foreign Application Priority Data

Apr. 10, 1992 [JP] Japan ..................... 4-091017
Aug. 6, 1992 [JP] Japan ..................... 4-210320

[51] Int. Cl.$^6$ ..................... G11B 5/66; B32B 5/16
[52] U.S. Cl. ............ 428/332; 428/336; 428/634 K; 428/634 TM; 428/634 MN; 428/634 EC; 428/300; 428/634 TS; 428/694 TS
[58] Field of Search ............... 428/634 K, 634 TM, 428/332, 336, 634 MM, 634 EC, 634 TS, 634 IS, 500

[56] References Cited

U.S. PATENT DOCUMENTS 4,748,089   5/1988   Kumasako et al. ............ 428/635

FOREIGN PATENT DOCUMENTS 3622241   1/1987   Germany .
025600    7/1987   Japan .
397282    4/1991   Japan .

OTHER PUBLICATIONS

Wagner, "Magnetic resonance in single-crystal dysprosium at 100 GHz", Phys. Rev. B, Mar. 1972 (Abstract).

Fert, Albert et al., "Les Super-Reseaux Magnétiques", La Recherche, Dec. 1990, No. 227, pp. 1492–1500.

Dieny, B. et al., "Giant magnetoresistance in soft ferromagnetic multilayers," Phys. Rev. Jan. 1991, pp. 1297–1300.

*Primary Examiner*—Leszek Kiliman
*Attorney, Agent, or Firm*—Birch, Stewart, Kolasch & Birch, LLP

[57] ABSTRACT

A magnetic lamination including at least a first magnetic film, a second magnetic film and, a third magnetic film, a first intervening intermediate film intervening between the first and second magnetic films, and a second intervening intermediate film intervening between the second and third magnetic films, wherein the respective magnetic films each comprise a magnetically soft film, the first and second intervening films differ in thickness, and one of the first and second intervening films can have a zero thickness and further, the intervening intermediate film can include a transition metal and a substance which is likely to form a heterogeneous mixture with the transition metal.

51 Claims, 8 Drawing Sheets

DURING DEPOSITION OF Ni-Fe

DURING DEPOSITION OF Co

DURING DEPOSITION OF Ni-Fe

DURING DEPOSITION OF Co

|  | DIRECTLY AFTER FORMATION | DURING APPLICATION OF STRONG MAGNETIC FIELD | AFTER REMOVAL OF MAGNETIC FIELD |
|---|---|---|---|
| Ni–Fe | → | ↗ | → |
| Co | → | ↗ | ↗ |

MAGNETIC HEADS AND MAGNETIC RECORDING REPRODUCING DEVICES USING MAGNETIC LAMINATIONS

BACKGROUND OF THE INVENTION

1. Field of the Invention

The present invention relates to magnetic laminations for use, for example, in magnetic heads or sensors, and more particularly to the lamination of magnetically hard and magnetically soft films alternately superposed in units of one or more or a lamination of at least one hard magnetic film and a magnetically soft multi-layer or a magnetically soft artificial lattice lamination.

2. Discussion of Related Art

Since a magnetically soft material such as a Ni—Fe alloy (permalloy) is capable of sensing a change in a weak magnetic field electrically, it can be used as a material of a magnetic head or a magnetic sensor. Research into and development of such materials have been made in many fields.

In order to improve the performance of an MR (Magneto Resistor) device using a magnetic lamination, research into and development of materials having higher magnetic sensitivity than the conventional one are demanded. As a result, a so-called giant magnetoresistive effect has recently been discovered in artificial lattice films of Fe/Cr or Co/Cu.

However, in the conventional artificial lattice films, no materials having sufficiently high magnetic field sensitivity (modulation degree) have been discovered, the main reason of which is that film thickness conditions are selected, where an antiferromagnetic combination occurs between adjacent magnetic films, in order to realize a so-called antiferromagnetic disposition where the directions of magnetization of adjacent magnetic layers are reverse to each other in a stabilized state of magnetization when the external magnetic field is zero.

SUMMARY OF THE INVENTION

It is an object of the present invention to provide a magnetic lamination of an increased magnetic field sensitivity which solves the above problems and a magnetic head and a magnetic recording/reproducing device which uses the magnetic lamination of an increased magnetic field sensitivity.

In order to achieve the above object, according to the present invention, there is provided a magnetic lamination including at least a first magnetic film, a second magnetic film, a third magnetic film, a first intervening film intervening between the first and second magnetic films, and a second intervening film intervening between the second and third magnetic films, wherein the respective magnetic films each comprise a magnetically soft film, the first and second intervening films differ in thickness, and one of the first and second intervening films can have a zero thickness, i.e., be excluded.

In order to achieve the above object, according to the present invention, there is further provided a magnetic lamination including at least a first magnetic film, a second magnetic film, a third magnetic film, a first intervening film intervening between the first and second magnetic films, and a second intervening film intervening between the second and third magnetic films, wherein the first and second intervening films differ in constituent material.

In order to achieve the above object, according to the present invention, there is further provided a magnetic lamination including three or more magnetic films, inclusive of a magnetically hard film, with or without an intervening film between adjacent magnetic films, wherein substantially stable directions of magnetization of adjacent magnetic films intersect at an angle in a range of from ±0°–±90°, at least one of the outermost film of the magnetic lamination being made of a magnetically hard film, and the magnetic lamination has a giant magnetoresistive effect.

In order to achieve the above object, according to the present invention, there is further provided a magnetic lamination including at least a first magnetic film, a second magnetic film, a third magnetic film, a first intervening film intervening between the first and second magnetic films, and a second intervening film intervening between the second and third magnetic films, wherein the first and second intervening films differ in thickness and one of the first and second intervening films can have a zero thickness, i.e., be excluded, the respective magnetic films comprising a magnetically soft film, and the magnetic lamination having a giant magnetoresistive effect.

In order to achieve the above object, according to the present invention, there is further provided a magnetic lamination including a plurality of magnetic films with or without an intervening film between adjacent magnetic films, wherein a giant magnetoresistive effect of the magnetic lamination based on an alternating magnetic field applied to the magnetic lamination exhibits no substantial hysteresis.

In order to achieve the above object, according to the present invention, there is provided a magnetic lamination including a magnetically hard film and a magnetically soft film with or without an intermediate film intervening between the first and second films, wherein the magnetically hard film is smaller in net magnetic moment than the magnetically soft film; and substantially stable directions of magnetization of from the hard and soft films intersect at an angle in a range of ±0°–±90°.

In order to achieve the above object, according to the present invention, there is provided a magnetic lamination including at least two magnetic films with an intermediate film intervening between the magnetic films, the intermediate film including a transition metal and a substance which is likely to form a heterogeneous mixture with the transition metal.

DETAILED DISCUSSION

As mentioned above, the present invention basically provides a magnetic lamination including at least a first magnetic film, a second magnetic film, a third magnetic film, a first intervening film intervening between the first and second magnetic films, and a second intervening film intervening between the second and third magnetic films, wherein the respective means render the magnetic interaction among the magnetic films to alternately ferromagnetic and antiferromagnetic to thereby cause the magnetic reluctance of the magnetic lamination to easily change. Thus, a magnetic lamination and a magnetic head (magnetic recording/reproducing device) having a high magnetic field sensitivity are provided.

According to the present invention, as mentioned above, the intermediate film includes a transition metal, and a substance which does not easily form a solid solution of the metal, i.e., a substance which is likely to form a heterogeneous mixture with the metal. It has an appropriate thickness (usually, as the intermediate film increases gradually from zero in thickness, the interaction between the magnetic films changes periodically, i.e., ferromagnetically→antiferromagnetically→ferromagnetically), i.e., such a thickness that the intermediate film by itself performs an antiferromagnetic interaction. It is composed of a mixture of a transition metal and a substance which is likely to form a heterogeneous mixture with the transition metal to thereby cause a ferromagnetic interaction to cancel the antiferromagnetic interaction.

This realizes a state where no substantial magnetic interaction occurs between both the magnetic films so that the respective magnetizations in the magnetic films behave independently. Thus, the formation of at least one of the magnetic films with a material good in soft-magnetic characteristic results in a giant magnetoresistive effect film which responds sufficiently to even a faint magnetic field applied thereto.

DESCRIPTION OF THE PREFERRED EMBODIMENTS

Figure 1:
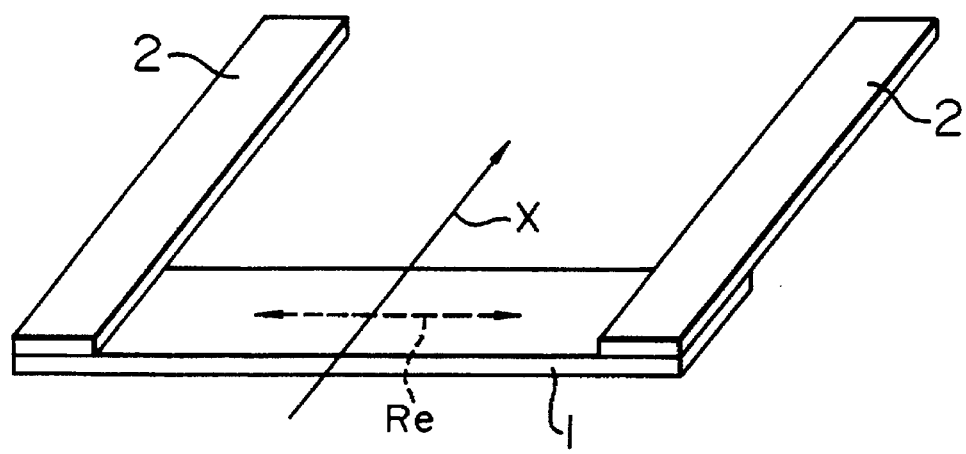
FIG. 1 is a perspective view of a magnetic head as a first embodiment of the present invention.
Figure 2:
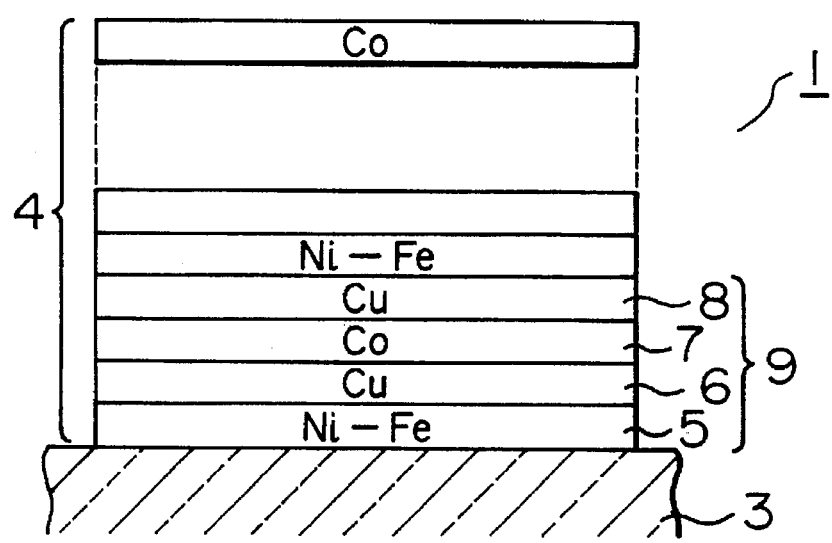
FIG. 2 is an enlarged cross-sectional view of a magnetic lamination used in the magnetic head.

Embodiments of the present invention will next be described. FIG. 1 is a perspective view of a magnetic head of one embodiment of the present invention. FIG. 2 is an enlarged cross-sectional view of a laminated magnetoresistive effect device used in the magnetic head.

As shown in FIG. 1, the magnetic head is mainly composed of a strip-like magnetic lamination 1 and a pair of electrodes 2 one end of each electrode being joined to each end of the film 1. The electrodes 2 can be separated as a current terminal and a voltage terminal (not shown), as required.

As shown in FIG. 2, the lamination 1 is composed of a substrate 3 made of glass or ceramic and a multi-film 4 formed on the substrate and made, for example, of Ni—Fe/Cu/Co/Cu.

More specifically, the multi-film 4 is composed of several superposed layers or scores of superposed layers each layer including a minimum lamination unit of a magnetically soft Ni—Fe alloy (permalloy) film 5 having a thickness of about 30 Å, an intermediate Cu film 6 having a thickness of about 30–80 Å, a magnetically hard Co film 7 having a thickness of about 30 Å, and a non-magnetic Cu film having a thickness of about 30–80 Å.

While the multi-films 4 are formed by sequential depositions of these films in corresponding predetermined thicknesses, for example, by superhigh vacuum electron beam, it may be formed, for example, by other thin film forming techniques, such as sputtering.

The soft and hard films 5 and 7 each are formed under a magnetic field applied thereto with its direction being at an angle to a predetermined reference direction Re. An example of the direction of the applied magnetic field will be described below with respect to FIGS. 3A–3D.

Figure 3A:
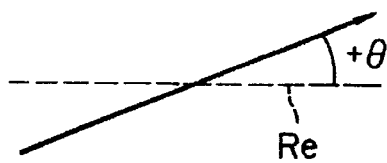
FIGS. 3A, 3B, 3C, and 3D illustrate the directions of magnetic fields applied to the respective films of the lamination.

As shown in FIG. 3A, a first soft film (Ni—Fe alloy film) 5 is first formed under an applied magnetic field with its direction being at an angle (+θ) to its predetermined reference direction Re.

Figure 3B:
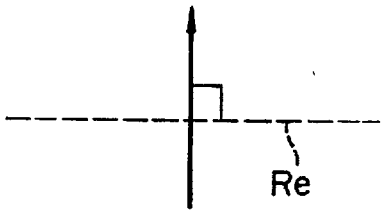

As shown in FIG. 3B, a first hard film (Co film) 7 is formed under an applied magnetic field with its direction being at right angles to its predetermined reference direction Re.

Figure 3C:
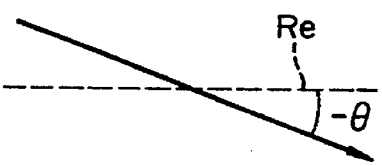

As shown in FIG. 3C, a second soft film (Ni—Fe alloy film) 5 is formed under an applied magnetic field with its direction being at an angle −θ to its predetermined reference direction Re.

Figure 3D:
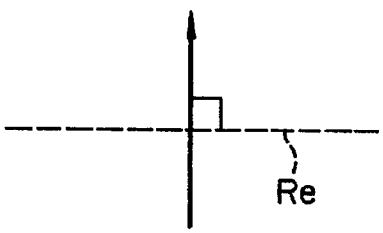

As shown in FIG. 3D, a second hard film (Co film) 7 is formed under an applied magnetic field with its direction at right angles to its predetermined reference direction Re.

Thereafter, similarly to FIG. 3A, a third soft film 5 is formed under an applied magnetic field with its direction being at an angle +θ to its predetermined reference direction Re; similarly to FIG. 3C, a fourth soft film 5 is formed under an applied magnetic field with its direction being at an angle −θ to its predetermined reference direction Re; and so forth. In this case, the respective angles involving the adjacent soft films 5 are opposite in sign; i.e., +θ, −θ. The hard films (Co films) 7 are formed under an applied magnetic field with its fixed direction being at right angles to the predetermined reference direction Re. The magnetic field applied when the soft and hard films 5 and 7 are formed is, for example, over hundreds of Oe.

After the formation of such multi-film 4 of a predetermined number of layers, a strong magnetic field is temporarily applied to the film 4 in a direction perpendicular to the predetermined direction Re (that is, in the X direction) in the same plane, as shown in FIG. 1, and then removed. Such orientation is preferably made in a raised temperature atmosphere to increase its effects.

This results in intersection of the direction of magnetization of the soft film 5 (the stabilized direction of magnetization when the external magnetic field is zero) with the direction of magnetization of the hard film 7 with an angle $\alpha$ therebetween. This angle $\alpha$ is properly selected in a range of $\pm 0°-\pm 90°$. When the absolute value of the angle $\alpha$ is $30°-90°$, preferably $45°-90°$ and more preferably $60°-90°$, a higher magnetic field sensitivity results.

While in the embodiment the magnetic fields are applied at alternately different angles $\pm\theta$ to the reference direction Re when the soft films 5 are formed, the present invention is not limited to this embodiment. For example, the first-mth film 5 may be formed under the applied magnetic field with its direction being at $\theta$ to the predetermined reference direction Re; the (m+1)-mth soft films 5 may be formed under the applied magnetic field with its direction being at $-\theta$ to the predetermined reference direction Re. The direction of the applied magnetic field may be changed for each of groups (in this case, two groups) of films.

Figure 4:
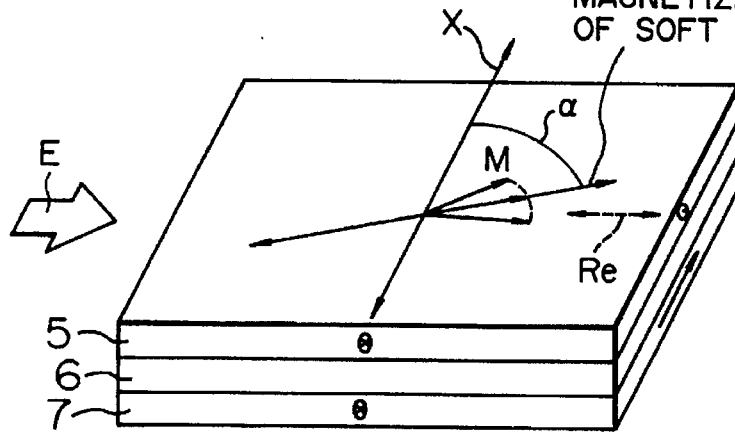
FIG. 4 illustrates an aspect of use of the magnetic lamination.

As Just described above, by selection of the thickness of an intermediate film (in the embodiment, the Cu film) which is not strongly magnetically coupled to the hard film 7, an angle $\alpha$ is provided between the directions of magnetization of the soft and hard films 5 and 7. Thus, as shown in FIG. 4, the magnetization of the soft film 5 is easily rotated relative to an external magnetic field X the direction of which is substantially perpendicular to the reference direction Re and, as will be obvious from an expression (A) to be described later, a change rate of the magnetic reluctance relative to a given rotational angle of the soft film 5 increases. Therefore, a magnetic lamination having a high magnetic field sensitivity is obtained. In FIG. 4, the arrow E shows the direction of a current flowing through the magnetic head.

The hard films each are preferably constituted by a ferrimagnetic, ferromagnetic transition metal-rare earth metal alloy (for example, Tb—Fb (Co), Dy—Fe (Co) or Nd—Fe (Co)) the compensated temperature of which is in the vicinity of a temperature where the magnetic lamination is used, and initialized at a temperature where the coercive force is relatively small with the last-mentioned temperature deviating from the compensated temperature for the ferrimagnetic material. By doing so, and when a magnetic lamination is used, for example, as a magnetic head, its temperature in use is in the vicinity of the compensated temperature, as mentioned above, and the total magnetization at that temperature is low. Thus adverse influence on a magnetic recording medium due to magnetization of the hard films is avoided, advantageously.

As described above, in the giant magnetoresistive effect artificial lattice film made of a lamination of alternating soft and hard films (in the present invention, the expression "giant magnetoresistive effect" implies a magnetoresistive effect where a sign in which direction the magnetic reluctance increases or decreases due to application of an external magnetic field to the films does not depend on the direction of the current flowing through the head), there is a strong tendency that antiferromagnetic or ferromagnetic coupling occurs between the soft and hard films. Thus, it can be difficult to set the direction of magnetization (the stabilized direction of magnetization when the external magnetic field is zero) in the soft films in any desired direction.

When $\alpha$ (the angle between the intersecting directions of magnetization of the soft and hard films of the magnetic lamination) changes by $\Delta\alpha$, a change $\Delta R$ in the resistance R is given by $$\Delta R/\text{average value } R = K \cdot \sin \alpha \cdot \Delta\alpha \quad (A)$$

where K is a constant determined by the material and structure of the magnetoresistive effect device. In order that the magnetoresistive effect device has a sufficient magnetic field sensitivity, the absolute value $|\alpha|$ of the angle is required to be set at any value in the range of $0-°90°$, as described above.

By rendering the magnetic interaction between the soft and hard films alternately ferromagnetic and antiferromagnetic, the opposite magnetic interactions act on the soft film disposed between its upper and lower hard films from both sides of the soft film and cancel each other. Thus, when a magnetic field is applied to the soft film to impart magnetic anistropy to the soft film, the magnetization is easily set in any direction.

Figures 5, 6:
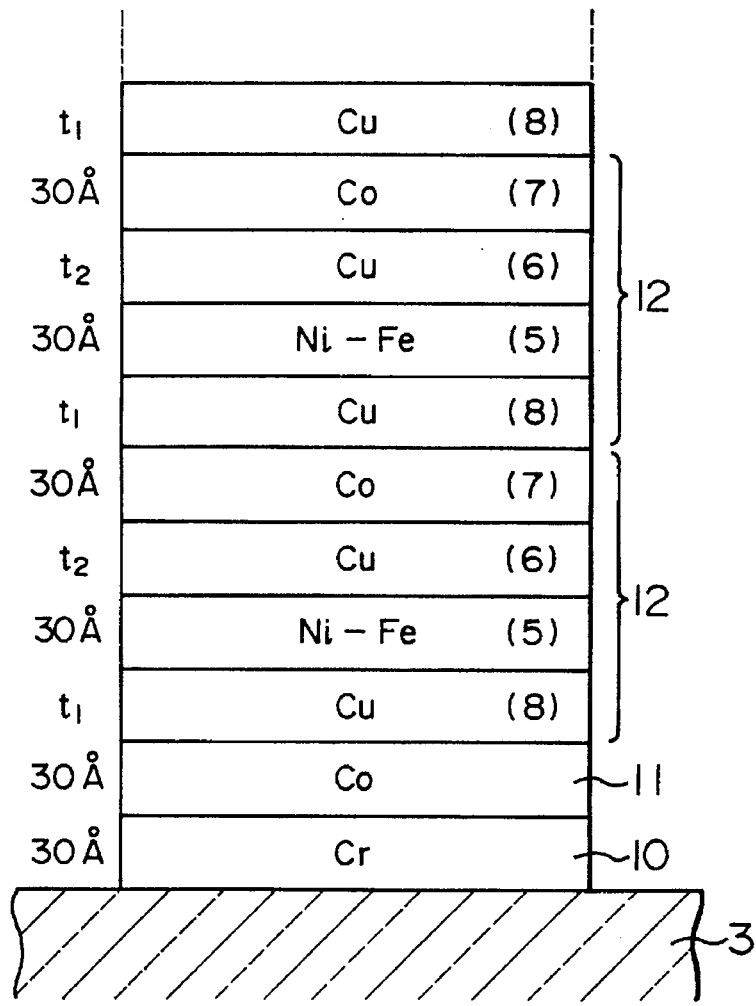
FIG. 5 is an enlarged cross-sectional view of a magnetic lamination as a second embodiment.
FIG. 6 illustrates the directions of easy magnetization axes and directions of magnetization of the respective films of the magnetic lamination directly after the formation of the respective films of the lamination, during application of a strong magnetic field to the lamination films and after removal of such magnetic field.

This embodiment will be described with respect to FIG. 5. As shown in FIG. 5, a Cr film 10 and then a Co film 11 are formed on a substrate 3 made, for example, of glass, and a predetermined number of minimum lamination units 12 of Cu/Ni—Fe/Cu/Co is formed in a repeated manner so as to be several Å—scores of Å thick.

More specifically, first, for example, a Cr film 10 having a thickness of about 30 Å and a Co film 11 having a thickness of about 30 Å are formed on the substrate 3. Thereafter, a predetermined number of minimum lamination units 12 is formed in a repeated manner with the minimum lamination unit being composed of an intermediate Cu film 8 having a thickness of $t_1$, a magnetically soft or Ni—Fe alloy (permalloy) film 5 having a thickness of about 30 Å, an intermediate Cu film 6 having a thickness of $t_2$, and a magnetically hard film 7 of Co having a thickness of about 30 Å.

The thicknesses $t_1$ and $t_2$ of the intermediate films 8 and 6 are set at such values that the magnetic interactions of the soft and hard films 5 and 7 becomes ferromagnetic and antiferromagnetic through those intermediate films. The specific thicknesses $t_1$ and $t_2$ of the intermediate films 6 and 8 are different ($t_1 \neq t_2$) as indicated in the following table:

TABLE

| Thickness $t_1$ of intermediate film 8 | Thickness $t_2$ of intermediate film 6 |
| --- | --- |
| 0–5 Å | 6–12 Å |
| 12–17 Å | 18–25 Å |
| 25–30 Å | 31 Å or more |

While in this example the intermediate film 8 is relatively thin to render the magnetic interaction of the soft and hard films 5 and 7 ferromagnetic and the intermediate film 6 is relatively thick to render the magnetic interaction of the soft and hard films 5 and 7 antiferromagnetic, the intermediate film 8 may conversely be relatively thick to render the magnetic interaction of the soft and hard films 5 and 7 antiferromagnetic, and the intermediate film 6 may be relatively thin to render the magnetic interaction of the soft and hard films 5 and 7 ferromagnetic.

The directions of magnetization of the soft and hard films 5 and 7 are controllable depending on the direction of the magnetic field applied to those films during their deposition.

A sufficiently strong magnetic field (by which the direction of magnetization of the hard film 7 is directed to the direction of the applied magnetic field, preferably, several thousands of Oe or more) is applied in any direction in the plane to direct the direction of magnetization of the hard film 7 to a desired one.

At this time the direction of the easy magnetization axis of the soft film 5 is also is directed to the direction of the applied magnetic field, and removal of the applied magnetic field maintains the direction of magnetization of the hard film 7 in the direction of the applied magnetic field. The direction of the easy magnetization axis of the soft film 5 is directed to its own direction of easy magnetization axis to thereby be stabilized because the interactions of the upper and lower hard films 7 with the soft film 5 are canceled substantially.

Since the easy magnetization axis direction of the soft film 5 is thus controlled by uniaxial magnetic anistropy induced on the film 5, it reacts very sensitively especially to an external magnetic field perpendicular to the direction of the easy magnetization axis to change its direction of magnetization.

FIG. 6 collectively shows the respective easy magnetization axes and directions of magnetization of a soft (Ni—Fe alloy) film and a hard (Co) film directly after their formation, and during application of and after removal of a strong magnetic field to and from the those films. As shown in FIG. 6, in the resulting laminated film, the directions of the easy magnetization axis of the soft (Ni—Fe alloy) film and the direction of magnetization of the hard (Co) film intersect.

While in the embodiment the intermediate films 6 and 8 are made of the same material and the thicknesses $t_1$ and $t_2$ of the films 6 and 8 are controlled such that the magnetic interactions of the soft film 5 and hard film 7 are sequentially rendered ferromagnetic and antiferromagnetic, the films 6 and 8 may be made of different materials to render the magnetic interactions of the films 5 and 7 rendered ferromagnetic and antiferromagnetic. Alternatively, the materials and thicknesses of the intermediate films may be different from each other.

The materials of the intermediate films usable are, for example, as follows:

1) Cu, Al, Au, Ag, Pt, Cr or Sn or an alloy of some of these metals;
2) Cu, Al, Au, Ag, Pt, Cr, Sn, a transition metal or an alloy of some of these metals;
3) B, C, $B_4C$, any of other borides or carbides or a mixture of some of these substances;
4) $Al_2O_3$, $Ta_2O_5$, SiO, $SiO_2$, ZnO, SnO, $Cr_2O_3$, $CrO_2$ or a mixture of some of these oxides;
5) Al—N, Sn—N or a mixture of these nitrides;
6) ZnS, CrS or a mixture of these sulfides;
7) Bi or a mixture of this semi-metal;
8) NbN, $Y_1Ba_2Cu_3Oy$ or a mixture of these superconducting materials.

When the inventive magnetoresistive effect device is used as a magnetic head, it is advantageous that the direction of magnetization of the hard film is substantially parallel to a recording surface of a magnetic recording medium in order to avoid a disturbance of the medium due to magnetization of the hard film.

If the direction of magnetization of the hard film is substantially parallel to the recording surface of the hard film and the easy magnetization axis of the soft film is substantially perpendicular to the recording surface of the medium, the sensitivity of the soft film to a leakage magnetic field from the magnetic recording medium would decrease.

If the direction of magnetization of the hard film is substantially parallel to the recording surface of the medium and the angle between the direction of magnetization of the hard film and the easy magnetization axis of the soft film intersecting with the direction of magnetization of the hard film is 15°–45°, and preferably about 30°, the soft film reacts sufficiently to a leakage magnetic field from the magnetic recording medium and a magnetic head having a large magnetoresistive effect is made.

When the magnetoresistive effect device is used as a magnetic head, magnetic flux perpendicular to a recording surface of the magnetic recording medium are to be detected. Thus, it is efficient that the direction of the easy magnetization axis of the soft film is set so as to be parallel to a recording surface of the medium when the applied external magnetic field is zero.

In order to provide a proper angle between the direction of the easy magnetization axis of the soft film and the direction of magnetization of the hard film, the magnetization of the hard film must have a component perpendicular to the recording surface of the medium. In this case, if all the directions of magnetization of the hard films are parallel in the same direction, the magnetic flux generated from an end surface of the magnetic head (laminated magnetoresistive effect device) is likely to disturb the magnetization of the recording medium.

If the effective overall thickness $t_{eff}$ of the magnetic head (laminated magnetoresistive effect device) is less than the effective spacing $h_f$ between the magnetic head and the magnetic recording medium, the degree of the disturbance is small. Its criterion is given by $$I_{S\perp eff}^H \cdot e - \frac{\pi h_f}{T_{eff}} < H_c\perp \qquad (1)$$

where $H_{c\perp}$ is the vertical coercive force of the magnetic recording medium, and $I_{s\perp eff}^H$ is the vertical component of saturated magnetization of the hard film.

$$I_{S\perp eff}^H = \frac{I_{S\perp}^H \cdot t_{total}^H}{t_{eff}} \qquad (2)$$

where $t_{total}^H$ in formula (2) is the total thickness of the hard film.

In the expression (1), $h_f$ varies depending on a magnetic recording/reproducing device used and is generally 10–50 nm in a magnetic recording/reproducing device of the type where the magnetic head and a magnetic recording medium contact.

If the respective terms of the expression (1) are set at values below, the expression (1) becomes an expression (3) the value of which exceeds a coercive force perpendicular to the surface of the recording medium:

$Hc\perp \approx 1 \times 10^5$ A/m
$I_{S\perp eff}^H \approx 4 \times 10^5$ A/m
$I_{s\perp eff}^H = 4 \times 10^5$ A/m
$t_{eff} \approx 50$ nm
$h_f \approx 20$ nm $$I_{S\perp eff}^H \cdot e - \frac{\pi h_t}{t_{eff}} \approx 1.1 \times 10^5 \text{ A/m} \qquad (3)$$

In order to solve this problem, the hard films are grouped so that their vertical components of magnetization cancel each other in the embodiment of the present invention.

Figure 7:
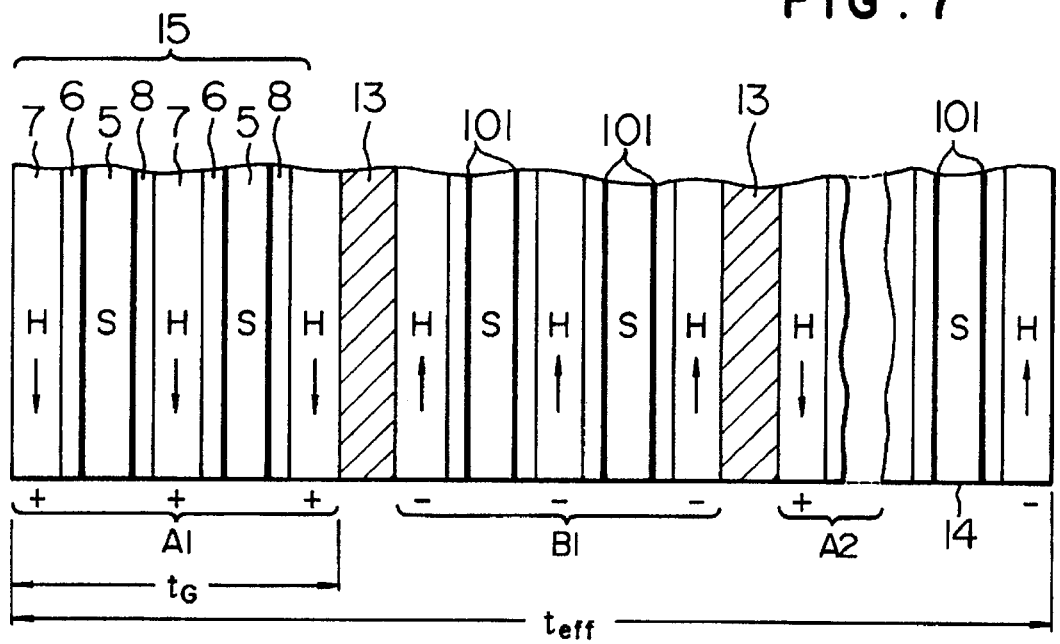
FIG. 7 is an enlarged cross-sectional view of a magnetic lamination as a third embodiment.

This state is schematically shown in FIG. 7 where reference numeral 13 denotes an electrically insulating layer made, for example, of SiO, SiO$_2$, Al$_2$O$_3$ or plastics; and 14, a surface of the device which faces a medium. As shown in FIG. 7, in the embodiment, a minimum lamination unit 15 is composed of a hard film (H) 7, non-magnetic film 6, soft film (S) 5, non-magnetic film 8, hard film (H) 7, non-magnetic film 6, soft film (S) 5, non-magnetic film 8, and hard film (H) 7. A predetermined number of superposed lamination units 15 is provided with an electrically insulating layer 13 intervening between any adjacent lamination units for insulating purposes.

As shown, the vertical magnetization components of the hard films (H) 7 are directed downward in a first lamination unit 15 (A1) while the vertical magnetization components of the hard films (H) 7 of the next second adjacent lamination unit 15 (B1) are directed upward such that the vertical magnetization components of the adjacent lamination units cancel each other. In this case, arrangement should be such that the following expression (4) holds:

$$I_{SL_{eff}}^H \cdot e - \frac{\pi h_f}{t_c} < Hc// \qquad (4)$$

where $t_G$ is the thickness of a minimum lamination unit; and Hc// is an intra-plane component of a coercive force in the magnetic recording medium.

While in the third embodiment the direction of magnetization of the hard films of any one unit of alternating hard and soft films is reverse to the direction of magnetization of the hard films of the adjacent unit with an electrically insulating film 13 intervening between the adjacent units, the direction of magnetization of the hard films may be reversed for each of successive minimum lamination units each composed of a hard film, a soft film and a hard film disposed in this order with an electrically insulating film intervening between any adjacent lamination units.

Figure 8:
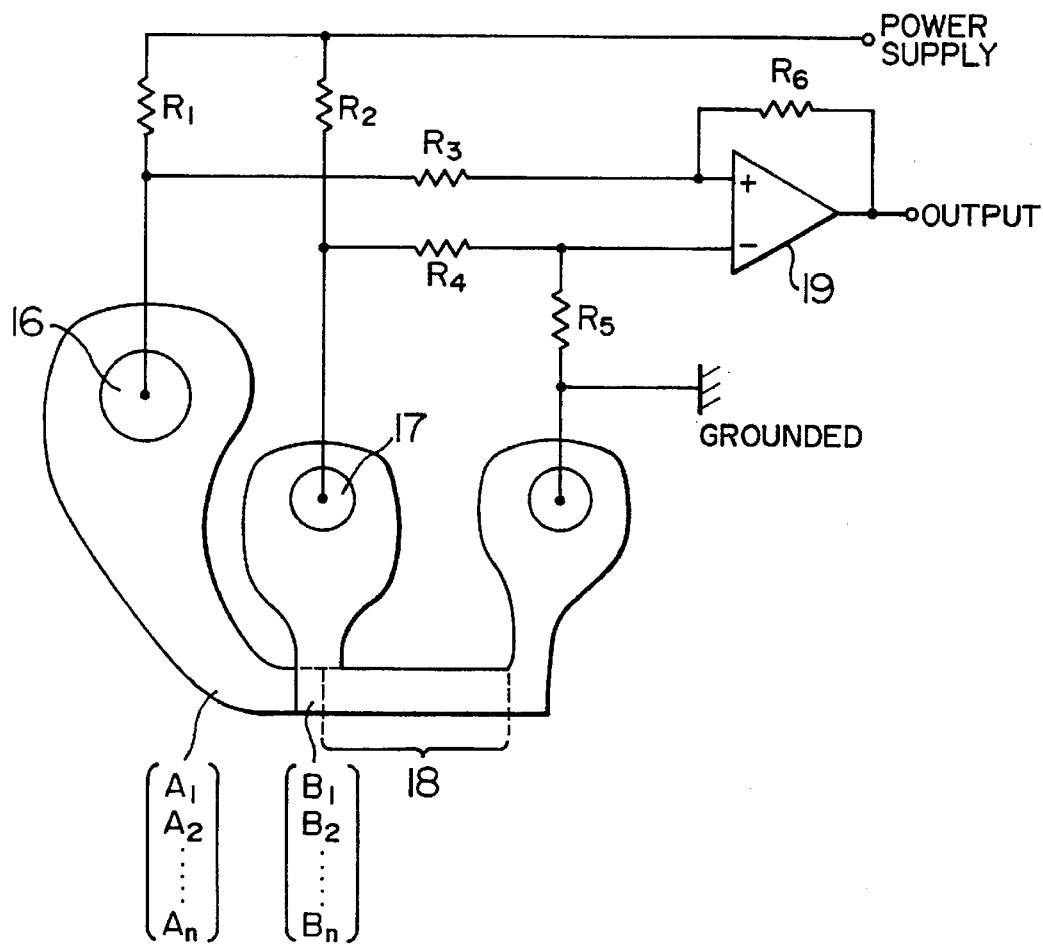
FIG. 8 is an electrical circuit diagram of a magnetic head as the third embodiment.

FIG. 8 is an electrical circuit diagram of a magnetic head thus constructed where a terminal 16 is connected to groups A (A1, A2 ... An) where the hard films have downward magnetic components while a terminal 17 is connected to groups B (B1, B2 ... Bn) where the hard films have upward magnetic components.

As described above, since the vertical magnetic components of the hard films in any group are reverse to those of the hard films in an adjacent group, and hence the manner in which the resistance changes in one group is reverse to that in which the resistance changes in an adjacent group, the circuit configuration shown in FIG. 8 is used in which a comparator 19 provides an output proportional to the difference in resistance between the groups A and B. A sensor 18 of the magnetic head senses magnetism and corresponds to the width of the track.

Figure 16:
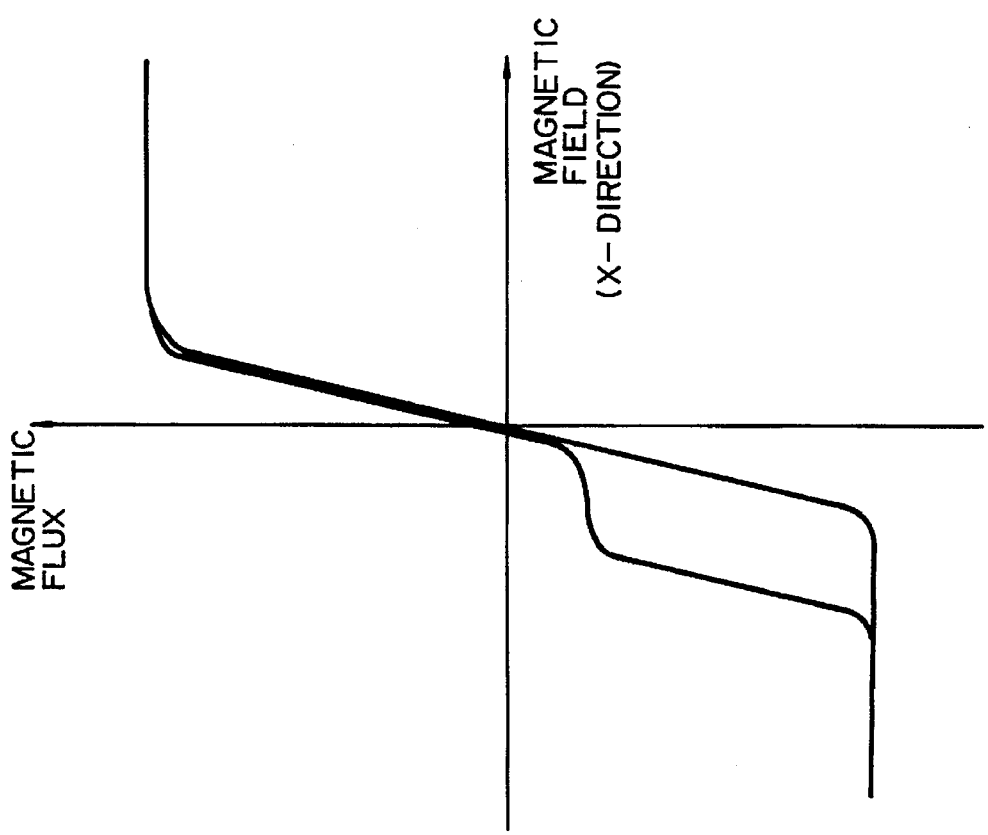
FIG. 16 is a magnetic flux-magnetic field characteristic diagram of a magnetic lamination.

The magnetic characteristic of a magnetic lamination will be described next where the angle α between the directions of magnetizations of the soft and hard films 5 and 7 is 45°. Generally, in the magnetic head, a magnetically shielding film (not shown) is formed on each of upper and lower surfaces of the laminated film 1 of FIG. 1. FIG. 16 shows the magnetic flux-magnetic field characteristic of only the magnetically shielding film-free magnetic lamination obtained when an external magnetic field is applied in the X direction of FIG. 1. In this example, the soft and hard films use Ni—Fe alloy and Co, respectively.

The magnetic flux increases with the magnetic field and is then saturated from the outside of the magnetic lamination in the X direction. Conversely, when a magnetic field is applied to the magnetic lamination in a direction at 180 degrees to the X direction, the laminated film shows a magnetic flux-magnetic field characteristic similar to that obtained when the magnetic field is applied in the X direction as long as the magnetic field is small while the magnetization of the Co film is reversed when the magnetic field exceeds a predetermined value. Thus, a hysteresised magnetization curve as shown in FIG. 16 is obtained.

As is seen in the magnetic flux-magnetic field characteristic, the coercive force (the magnitude of the magnetic field present when the magnetic flux is zero) is about 10 oersteds at most and generally several oersteds.

An appropriate hard film is a hybrid film composed of the soft film and an antiferromagnetic film (for example, of Fe—Mn alloy, Ni—Mn alloy, Cr—Mn alloy or NiO) or a hybrid film composed of the soft film and a permanent magnet film (for example, of Co—Pt alloy, Al—Ni—Co alloy or Ba ferrite).

Figure 17:
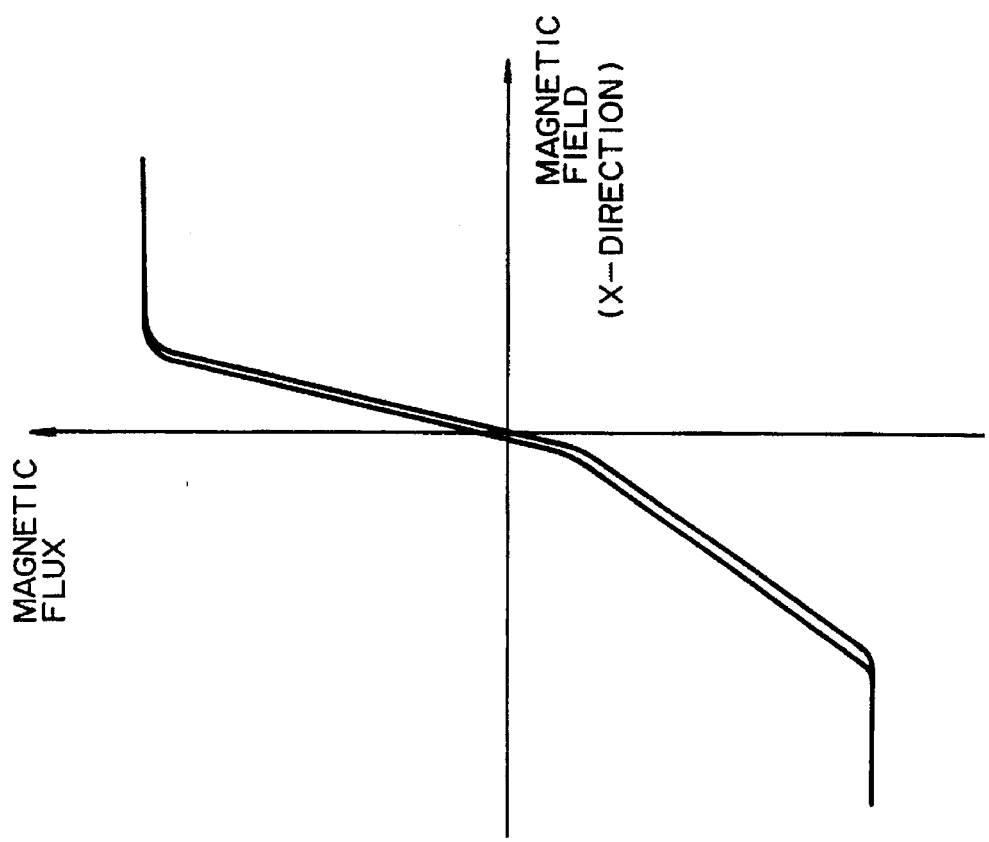
FIG. 17 is a magnetic flux-magnetic field characteristic diagram of a magnetic lamination.

FIG. 17 shows a magnetic flux-magnetic field characteristic curve of a magnetic lamination which uses a hybrid film of Ni—Fe and Fe—Mn as the hard films. The curve exhibits no large hysteresis unlike the curve of the laminated film which uses Co in the hard film (FIG. 16).

When a magnetic field is applied at 180 degrees to the X direction, a gradient with which the magnetic flux increases decreases as the magnetic field applied in the reverse direction increases because the hard film uses Fe—Mn and the exchange bias has increased an anisotropic magnetic field.

As will be obvious from FIGS. 16 and 17, the magnetic characteristics are different in a range where the external magnetic field is large while the magnetic characteristics are substantially the same in a range where the external magnetic field is smaller. Since the magnetic head is used in this range where the external magnetic field is smaller, there is no large problem in the magnetic laminations which exhibit the magnetic characteristics of FIGS. 16 and 17.

Almost all the layers of the magnetic lamination are metal films, which are subjected to a thermal history in the process of making a magnetic head, and the maximum temperature in the process is predicted as at least 150°.

In order to effectively prevent a deterioration in the magnetic characteristic of the magnetic lamination even when it is subjected to such thermal history, a thin diffusion preventive film 101 is provided on the interface different substances or on at least one of the interfaces of magnetically soft, intermediate and hard films to prevent the diffusion of different metals.

As the diffusion preventive films, the following are usable. They are preferably provided on the interface of any adjacent different metals films.

1) Nitrides: AlN or SiN;

2) Oxides: Ta$_2$O$_5$, Al$_2$O$_3$, SiO, SiO$_2$, ZnO, SnO or Cr$_2$O$_5$;

3) Sulfides: ZnS or CrS;

4) Carbides: B$_4$C;

5) Semi-metals: B or C; and

6) High-melting point metals: W, Ta, Mo or Nb.

The thicknesses of the magnetic films (magnetically hard and soft films) and the intermediate film are limited so as to be less than the mean free path of electrons in the materials which constituting the magnetic films. The mean free path of the electrons is an average distance λg through which the electrons travel between their two similar collisions due to thermal motion and measured in a bulk state of the materials concerned.

Figure 9:
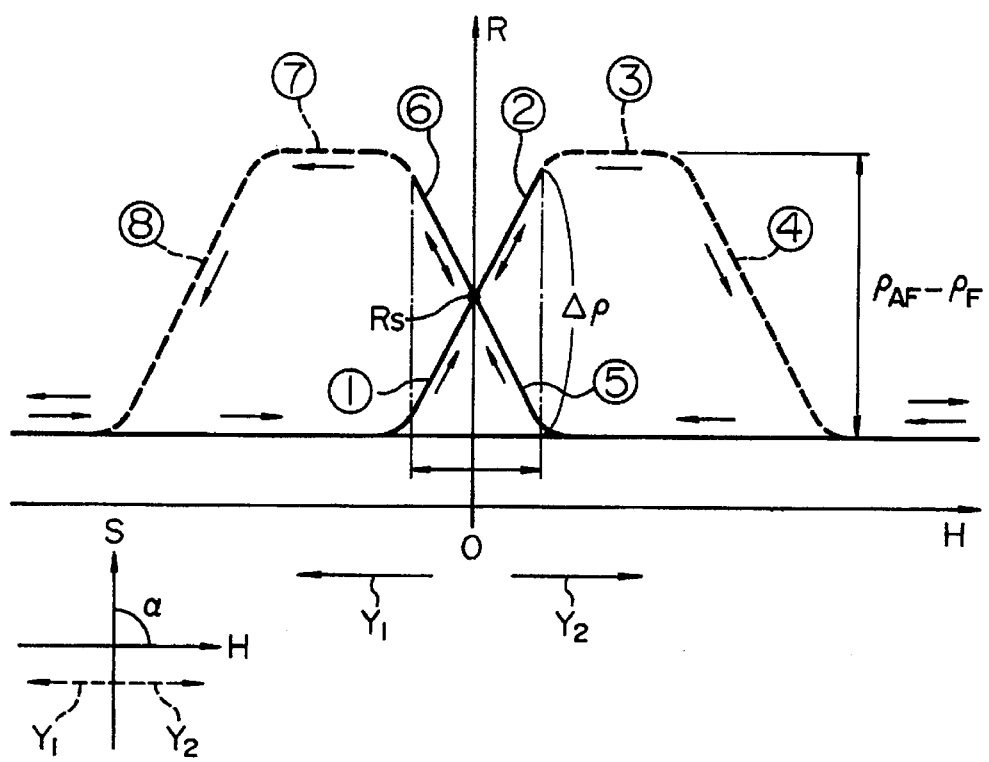
FIG. 9 is an H—R characteristic of the magnetic laminations as the embodiments of the present invention.
Figure 10:
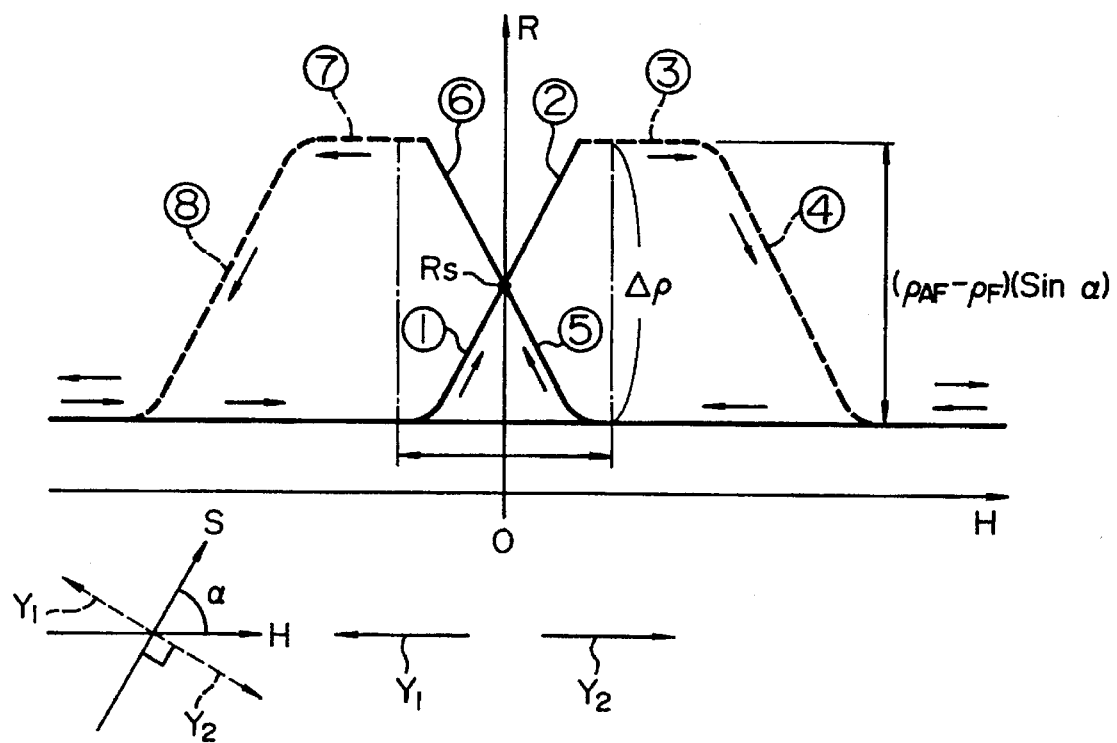
FIG. 10 is an H—R characteristic of the magnetic laminations as the embodiments of the present invention.

FIGS. 9 and 10 each show the changing state of the magnetic reluctance R of a magnetic lamination where the substantial stabilized directions of magnetization of adjacent magnetic films of the lamination intersect at an angle in a range of ±0°–±90° when the magnetic lamination is impressed with an external alternating magnetic field, as in the present invention.

FIG. 9 shows a characteristic curve obtained when the directions of magnetization H and S of the magnetically hard and soft films, respectively, intersect at 90° to each other and the direction of the external magnetic field Y is parallel to the direction of magnetization H of the hard film.

FIG. 10 shows a characteristic curve obtained when the directions of magnetization H and S of the magnetically hard and soft films, respectively, intersect at 60° (or 30°) to each other and the direction of the external magnetic field Y is perpendicular to the direction of magnetization H of the hard film.

As shown in FIGS. 9 and 10, when a sufficiently strong external magnetic field is initially applied in a $Y_1$ direction and then gradually decreased, the magnetic reluctance R increases gradually as shown in (1); when the external magnetic field is zero, the reluctance R exhibits a value of $R_s$; when the direction of the external magnetic field is then changed to a $Y_2$ direction and the strength of the external magnetic field is gradually increased, the reluctance R further increases as shown in (2); as the external magnetic field is increased to some extent, the reluctance R arrives at a saturated value or a top of a so-called plateau, as shown in (3). As the strength of the external magnetic field is increased further, the reluctance in turn decreases gradually as shown in (4).

As the strength of the external magnetic field in the $Y_2$ direction is decreased gradually, the reluctance R increases gradually as shown in (5); when the external magnetic field is zero, the reluctance exhibits the value $R_s$; when the direction of the external magnetic field is then changed to the $Y_1$ direction and the strength of the external magnetic field is gradually increased, the reluctance R further increases as shown in (6); when the external magnetic field increases to some extent, the reluctance R arrives at a saturated value or the top of a so-called plateau, as shown in (7). As the strength of the external magnetic field is increased further, the reluctance in turn decreases gradually as shown in (8).

In the regions shown by the solid lines in the characteristic diagrams, a giant magnetoresistive effect is substantially linear with the applied external magnetic field, and there is a coercive force of substantially less than 5 oersteds. In the regions shown by broken lines, a giant magnetoresistive effect is non-reversible under the applied external magnetic field.

As shown in FIGS. 9 and 10, a ratio $\Delta\rho/\rho_{AF}-\rho_F$ is practically more than 1/10, preferably more than 1/4, more preferably more than 1/3, further more preferably more than 1/2, and most preferably substantially 1 where $\Delta\rho$ is the maximum value of a change in the resistivity in a region where the giant magnetoresistive effect of the magnetic film has a coercive force of less than 5 oersteds, and $(\rho_{AF}-\rho_F)$ is a saturated value of the resistivity. That the ratio $\Delta\rho/\rho_{AF}-\rho_F$ is 1 (unity) implies that $\Delta\rho=\rho_{AF}-\rho_F$, in other words, the maximum value $\Delta\rho$ has arrived at the saturated value $|\rho_{AF}-\rho_F|$ of the resistivity.

That the $\Delta\rho/\rho_{AF}-\rho_F$ approaches 1 (unity) implies that the range of the external magnetic field in which the giant magnetoresistive effect of the magnetic films exhibits substantially no hysteresis increases and hence the area of the magnetic lamination which is sensitive to magnetism expands.

When a magnetic lamination is formed by alternate superposition of magnetically hard and soft films in units of one or more, the net or total magnetic moment of the magnetically hard films is preferably smaller than that of the magnetically soft films.

Figure 11:
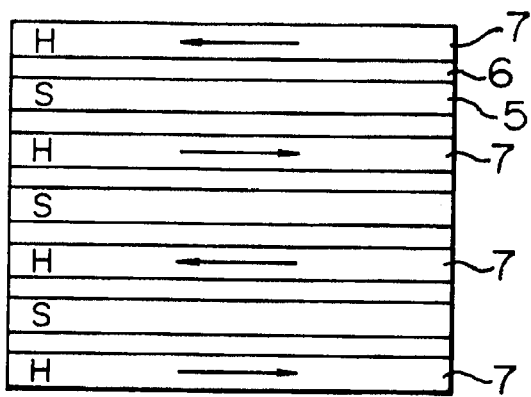
FIG. 11 is an enlarged cross-sectional view of a magnetic lamination as another embodiment.

FIG. 11 shows one illustrative means for providing a difference in magnetic moment between the magnetically hard and soft films. In this case, the directions of magnetization of the magnetically hard films 7 in a laminated film where the magnetically hard and soft films 7 and 5 are superposed alternately with or without an intermediate film 6 intervening between adjacent films 7 and 5 are alternately reversed in the direction of lamination. This causes the magnetically hard films 7 to cancel their magnetizations. As a result, the net magnetic moment of the magnetically hard films is smaller than that of the magnetically soft films, as viewed as the magnetic lamination.

As another specific means, by construction of magnetically hard films with a ferrimagnetic material, the net magnetic moment of the magnetically hard films is smaller than that of the magnetically soft films, as viewed as the magnetic lamination.

In a magnetic lamination with two or more magnetically hard films in the present invention, the first and second hard films may differ in material from each other. As an example, the first and second hard films may be made of Co and Co—Cr alloy, respectively. Alternatively, they may be made of the same Co—Cr alloy such that the contents of Cr in the alloys in the first and second films differ from each other in a range of a value, which is larger than 0, to 30% by weight. Alternatively, they may be made of materials completely different from each other.

Figure 12:
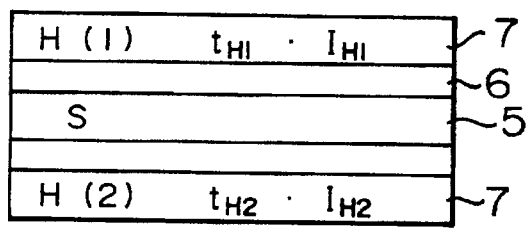
FIG. 12 is an enlarged cross-sectional view of a magnetic lamination as in another embodiment.

In a magnetic lamination with two or more magnetically hard films, as shown in FIG. 12, design may be made such that the product of the thickness $t_{H1}$ and strength $I_{M1}$ of the first hard film H(1) is substantially equal to the product of the thickness $t_{H2}$ and strength $I_{M2}$ of the second hard film H(2) (i.e., $t_{M1} \cdot I_{M1} \approx t_{M2} \cdot I_{M2}$).

Figure 13:
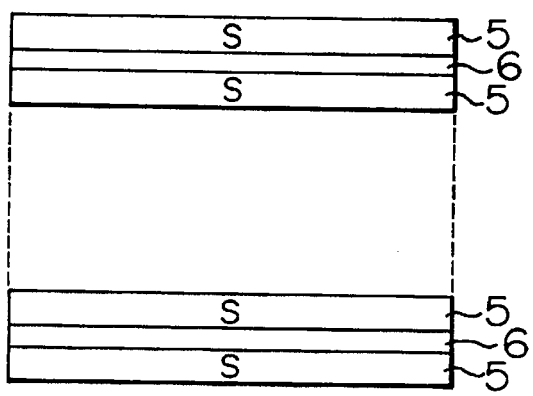
FIG. 13 is an enlarged cross-sectional view of a magnetic lamination as in another embodiment.

While in the above embodiments magnetically hard and soft films made of Co and Ni—Fe alloy, respectively, are superposed alternately (H-S-H-S- ... ... -S-H), the present invention is not limited to them. For example, as shown in FIG. 13, a magnetic lamination may be formed by sequential superposition of only magnetically soft films 5 (S-S- ... ... -S-S) with or without intervening intermediate films 6 different in thickness from the soft film 5.

Figure 14:
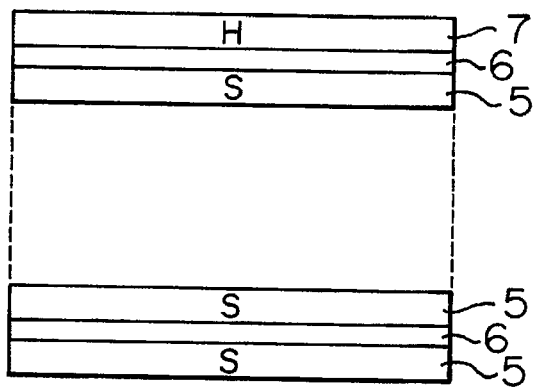
FIG. 14 is an enlarged cross-sectional view of a magnetic lamination as another embodiment.

As shown in FIG. 14, a magnetic lamination may be composed of a single magnetically hard film 7 and a plurality of magnetically soft films 5 (H-S- ... ... -S-S) or of a predetermined number of superposed groups of soft films 5 with a hard film 7 intervening between adjacent groups of soft films 5 (H-S-S- ... ... -S-H-S-S- ... ... -S-S-H) such that the magnetic interaction between the soft films 5 is rendered ferromagnetic or antiferromagnetic in their alternately stabilized states. In such structure, one of the magnetically hard films 7 is preferably in the vicinity of the outside of the magnetic lamination.

The magnetically hard films 7 are preferably made of a ferrimagnetic material or a composite film of an antiferromagnetic material, for example, made of an nickel oxide and a magnetically soft film, for example, of permalloy.

Figure 15:
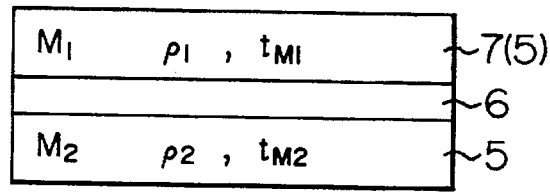
FIG. 15 is an enlarged cross-sectional view of a magnetic lamination as another embodiment.

Irrespective of the above combinations of the films, i.e., (H-S-H-S- ... ... -S-H), (S-S- ... ... -S-S). (H-S- ... ... -S-S), and (H-S-S- ... ... -S-H-S-S- ... ... -S-S-H), $(\rho_1 \cdot t_{M1})/(\rho_2 \cdot t_{M2})$ is 0.1–1.0, preferably 0.3–3, and more preferably 0.3–1 where $\rho_1$ and $t_{M1}$ are the resistivity and thickness, respectively, layer structure as shown in FIG. 15, of a first magnetic film $M_1$ of any adjacent magnetic films, and $\rho_2$ and $t_{M2}$ are the resistivity and thickness, respectively, of a second magnetic film $M_2$ of the adjacent magnetic films. The values are ones in the bulk states of the magnetic materials used.

Figure 18:
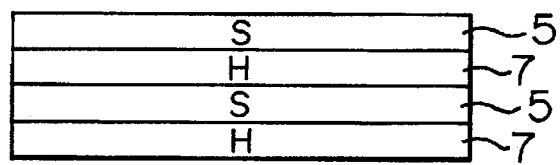
FIG. 18 is an enlarged cross-sectional view of a magnetic lamination as another embodiment.

FIG. 18 shows another embodiment of the magnetic lamination in which the materials of the magnetically soft and hard films 5 and 7 are selected and the magnetic interaction between the respective magnetic films is rendered ferromagnetic and antiferromagnetic alternately with no intermediate film being used.

Figure 19:
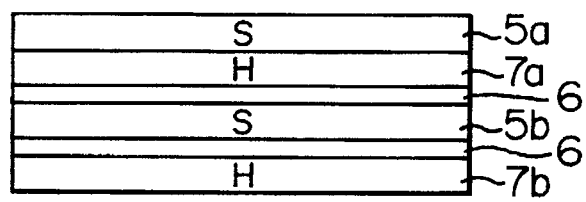
FIG. 19 is an enlarged cross-sectional view of a magnetic lamination as another embodiment.

FIG. 19 shows a still another embodiment of the magnetic lamination in which no intermediate film intervenes between a first soft film 5a and an adjacent first hard film 7a; an intermediate film 6 intervenes between the first hard film 7a and the next second soft film 5b; and a second intermediate film 6 intervenes between the second soft film 5b and a second hard film 7b. The second intervening film 6 is not necessarily required. The embodiment illustrates the intermediate film intervening between the magnetic films coupled ferromagnetically or antiferromagnetically.

While in the embodiment the Ni—Fe/Cu/Co materials have been described, the present invention is not limited to those materials. For example, Fe/Cr, Ag/Co, Ni/Ag, Fe/Co/Cu/Fe or Co/Cu, or Cu/Co/Cu/Ni—Fe materials or alloys which mainly contain some of these metals may be used.

Figure 20:
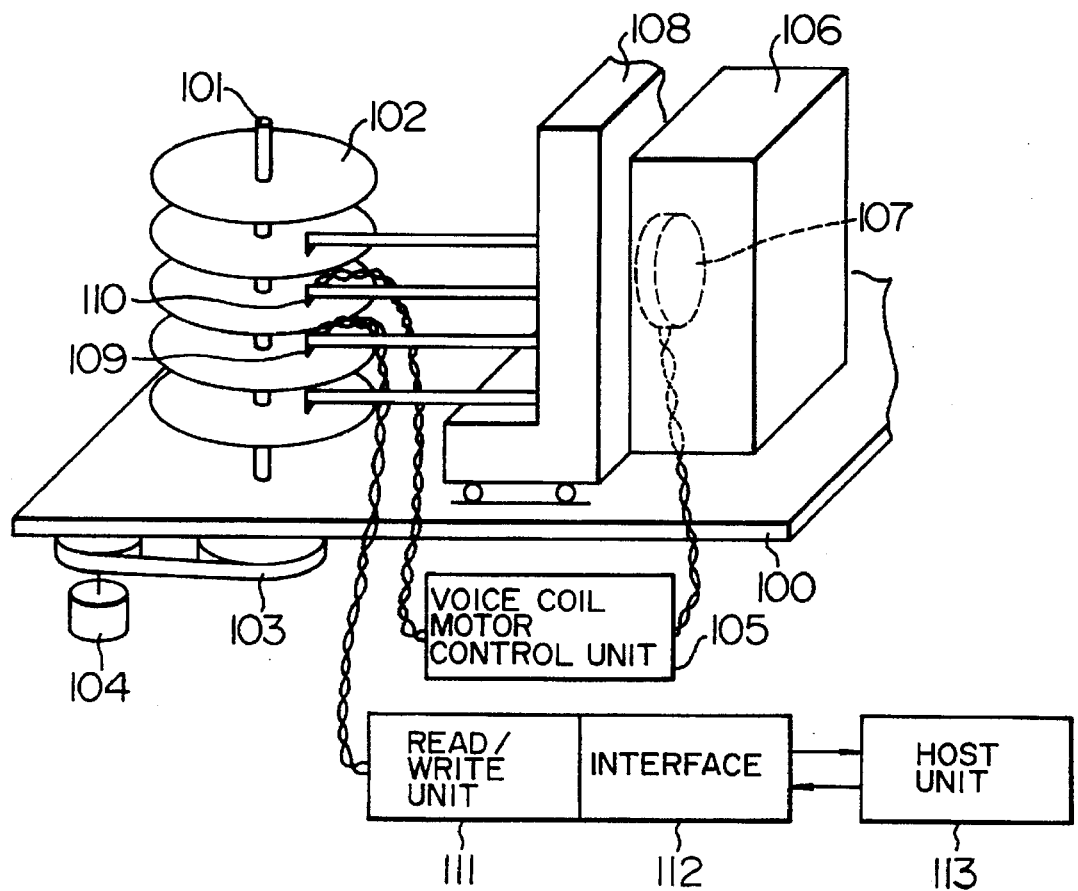
FIG. 20 is a schematic of a magnetic recording/reproducing device as an embodiment of the present invention.

FIG. 20 illustrates the outline of a magnetic recording/reproducing device which uses the magnetic head as mentioned above.

As shown in FIG. 20, a base 100 rotatably supports a spindle 101 to which a plurality of axially spaced magnetic disks 102 is fixed. As well known, each magnetic disk 102 is composed of a non-magnetic substrate and a magnetic film formed on the substrate.

Each disk 102 is rotated by a drive motor 104 through the spindle 101 and a speed change means 103. A control current flows from a voice motor control unit 105 to a voice coil 107 provided in a magnet 106. The interaction of the magnetic field based on the magnet 106 and the control current constitutes a voice coil motor, which moves a carriage 108 in a predetermined direction.

Attached as a unit on the carriage 108 are a data magnetic head 109 and a positioning magnetic head 110. The data magnetic head 109 is connected to a read/write unit 111 to send/receive signals to/from the disk 102 for date reading/writing purposes. The read/write unit 111 is connected through an interface 112 to a host unit 113. The above magnetic lamination is used in the form of FIG. 1 in a data reader or writer of the data magnetic head 109.

The positioning magnetic head 110 is connected to the voice motor control unit 105 to optically or magnetically detect the position of the magnetic head relative to the magnetic disk 102 and deliver data on the position to the voice motor control unit 105 to provide servo control over the tracking of the data magnetic head 109 relative to the magnetic disk 102.

According to the above embodiments, a magnetic lamination is basically composed of at least a first, a second, a third magnetic film, a first intermediate film intervening between the first and second films and a second intermediate film intervening between the second and the third magnetic films. The magnetic interactions between the magnetic films are rendered alternately ferromagnetic and antiferromagnetic by various means, as mentioned above. Thus, the magnetic reluctance of the magnetic lamination is easily changed, for example, by an external magnetic field. Thus, a magnetic lamination and a magnetic head (magnetic recording/reproducing device) having high sensitivity to a magnetic field are provided.

The present invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A magnetic lamination for use in a magnetic sensor comprising at least one pair of magnetic films, each of said magnetic films comprising at least a first magnetic film, a second magnetic film, a third magnetic film, a first intervening intermediate film disposed between said first and second magnetic films, and a second intermediate film disposed between said second and third magnetic films, wherein said first intermediate film and said second intermediate film have different thicknesses whereby one of said first and second intervening intermediate films can have a zero thickness, such that said first intermediate film functions to combine said first and second magnetic films ferromagnetically and said second intermediate film functions to combine said second and third magnetic films antiferromagnetically.

2. A magnetic lamination according to claim 1, wherein substantially stable directions of magnetization of consecutive magnetic films intersect at an angle.

3. A magnetic lamination for use in a magnetic sensor comprising at least a first magnetic film, a second magnetic film, a third magnetic film, a first intermediate film disposed between said first and second magnetic films, and a second intermediate film disposed between said second and third magnetic films, and one of said first and second intervening intermediate films can have a zero thickness wherein said first and second intermediate films are comprised of different materials so that said first intermediate film functions to combine said first and second magnetic films ferromagnetically and said second intermediate layer functions to combine said second and third magnetic films ferromagnetically.

4. A magnetic lamination according to claim 3, wherein substantially stable directions of magnetization of consecutive magnetic films intersect at an angle.

5. A magnetic lamination for use in a magnetic sensor, comprising three or more magnetic films, inclusive of a magnetically hard film, and intermediate films defined as in claims 1 or 3, wherein substantially stable directions of magnetization of consecutive magnetic films intersect at an angle in a range of from $0°-\pm 90°$, at least a topmost layer or bottom most layer of said films of said magnetic lamination being made of a magnetically hard film, said magnetic lamination having a giant magnetoresistive effect.

6. A magnetic lamination according to claim 5, wherein said magnetic lamination comprises a lamination of magnetically soft films.

7. A magnetic lamination for use in a magnetic sensor comprising at least one pair of magnetic films, each of said magnetic films comprising at least a first magnetic film, a second magnetic film, and a third magnetic film, a first intermediate film disposed between said first and second magnetic films, and a second intermediate film disposed between said second and third magnetic films, and one of said first and second intervening intermediate films can have a zero thickness;

wherein said first and second intermediate films have different thicknesses such that said first intermediate film functions to combine said first and second magnetic films ferromagnetically and said second intermediate film functions to combine said second and third magnetic films antiferromagnetically; and wherein said first and second intermediate films differ in constitution.

8. A magnetic lamination according to claims 3 or 4, wherein at least one magnetic film of said magnetic lamination comprises a magnetically hard film.

9. A magnetic lamination according to claim 8, wherein said magnetically hard film comprises a composite film which comprises an antiferromagnetic film and a magnetically soft film.

10. A magnetic lamination according to claim 8, wherein said magnetically hard film comprises a composite film which comprises a permanent magnet film and a magnetically soft film.

11. A magnetic lamination according to claim 8, wherein said magnetically hard film is made of a ferrimagnetic material.

12. A magnetic lamination for use in a magnetic sensor comprising at least one pair of magnetic films, each of said magnetic films comprising a first magnetically hard film and a second magnetically soft film and at least one of said first and second intermediate films as defined in claims 1 or 3, wherein the net magnetic moment of said magnetically hard film is smaller than that of said magnetically soft film; and substantially stable directions of magnetization of said hard and soft films intersect at an angle in a range of from $0°-\pm 90°$.

13. A magnetic lamination according to claim 12, wherein said magnetic lamination comprises a lamination of alternately superposed magnetically soft and hard films.

14. A magnetic lamination according to claim 12, wherein said magnetic lamination comprises at least two magnetically hard films which differ in constituent material from each other.

15. A magnetic lamination according to claim 12, wherein said magnetic lamination comprises at least two magnetically hard films, the value of the product of the thickness ($t_{H1}$) and strength of magnetization ($I_{H1}$) of a first hard film of said at least two hard films is substantially equal to the value of the produce of the thickness ($t_{H2}$) and strength of magnetization ($I_{H2}$) of a second hard film of said at least two films, i.e., ($t_{H1} \cdot I_{H1} \approx t_{H2} \cdot I_{H2}$).

16. A magnetic lamination according to any one of claims 1, 3, 5, 7, or 12 wherein a ratio $t_{M1} \cdot \rho_1 / t_{M2} \cdot \rho_2$ is 0.1–10, where $t_{M1}$ and $\rho_1$ are the thickness and resistivity, respectively of the first magnetic film and $t_{M2}$ and $\rho_2$ are the thickness and resistivity, respectively, of the second magnetic film.

17. A magnetic lamination according to any one of claims 1, 3, 5, 7, or 12 wherein at least one of said intermediate films is made of at least one constituent selected from at least one of the groups consisting of:

a) Cu, Al, Au, Ag, Pt, Cr or Sn or an alloy of at least two of said metals;

b) Cu, Al, Au, Ag, Pt, Cr, Sn, a transition element or an alloy of at least two of said metals;

c) B, C, B$_4$C, or a mixture thereof;

d) Al$_2$O$_3$, Ta$_2$O$_5$, SiO, SiO$_2$, ZnO, SnO, Cr$_2$O$_3$, CrO$_2$ or a mixture of at least two of said oxides;

e) Al—N, Sn—N or a mixture of at least two of said nitrides;

f) ZnS, CrS or a mixture of at least two of said sulfides;

g) Bi or a mixture of said semi-metal; and h) NbN, Y$_1$Ba$_2$Cu$_3$Oy or a mixture of said superconducting materials.

18. A magnetic lamination according to claim 12, comprising a metal diffusion preventive film provided on at least one of said magnetically soft film, said magnetically hard film, and said intermediate film between said magnetically soft and hard films, said preventive film comprising at least one member selected from the group consisting of a nitride, carbide, sulfide, oxide, semi-metal and at least one metal selected from W, Ta, Mo and Nb.

19. A magnetic lamination comprising:

at least two magnetic films, wherein each of said magnetic films comprise a first and a second magnetic film with an intermediate film disposed between said first and second magnetic films of each of said at least two films, and wherein each of said intermediate films comprises a mixture of a transition metal and a heterogeneous material with said transitional metal, so that a magnetic coupling between each of said first and second magnetic films becomes either a ferromagnetic or an antiferromagnetic coupling, respectively.

20. A magnetic lamination according to claim 19, wherein said transition metal comprises at least one member selected from the group consisting of Cr, Mn, Fe, Co and Ni; and said substance which forms a heterogeneous mixture with said transition metal is at least one metal selected from the group consisting of Ti, V, Cr, Cu, Ag, Au, Pt, Ir, Al, Si, Ge, Ta, W and Bi.

21. A magnetic lamination according to claim 19, wherein at least one of said magnetic films comprises a magnetically hard film and the rest of magnetic films comprise magnetically soft films.

22. A magnetic lamination according to claim 21, wherein said magnetically hard and soft films are alternately superposed.

23. A magnetic lamination according to claim 19 or 20, comprising at least a first magnetic film, a second magnetic film, and a third magnetic film, a first intermediate film disposed between said first and second magnetic films, and a second intermediate film disposed between said second and third magnetic films, wherein said respective magnetic films each comprise a magnetically soft film, said first and second intermediate films differing in thickness.

24. A magnetic lamination according to claim 23, wherein substantially stable directions of magnetization of consecutive magnetic films intersect at an angle in a range of from $0°-\pm 90°$.

25. A magnetic lamination according to claim 19 or 20, comprising at least a first magnetic film, a second magnetic film, and a third magnetic film, a first intermediate film disposed between said first and second magnetic films, and a second intermediate film disposed between said second and third magnetic films, wherein said first and second intermediate films differ in constituent material.

26. A magnetic lamination according to claim 25, wherein substantially stable directions of magnetization of consecutive magnetic films intersect at an angle in a range of from $0°-\pm 90°$.

27. A magnetic lamination according to claim 25, wherein said first and second intermediate films differ in thickness and one of said first and second intermediate films can have a zero thickness.

28. A magnetic lamination according to claim 19 or 26, comprising three or more magnetic films, inclusive of a magnetically hard film, with an intermediate film between consecutive magnetic films, and substantially stable directions of magnetization of consecutive magnetic films intersect at an angle in a range of from $0°-\pm 90°$, at least topmost or bottom most film of said magnetic lamination being made of a magnetically hard film, said magnetic lamination having a giant magnetoresistive effect.

29. A magnetic lamination according to claim 28, wherein said magnetic lamination mainly comprises a lamination of magnetically soft films.

30. A magnetic lamination according to claim 19 or 20, comprising at least a first magnetic film, a second magnetic film, and a third magnetic film, a first intermediate film disposed between said first and second magnetic films, and a second intermediate film disposed between said second and third magnetic films, wherein said first and second intermediate films differ in thickness, said respective magnetic films comprising a magnetically soft film, and said magnetic lamination has a giant magnetoresistive effect.

31. A magnetic lamination according to claim 30, wherein said first and second intervening intermediate films differ in constituent material.

32. A magnetic lamination according to claim 19 or 20, wherein a giant magnetoresistive effect of said magnetic lamination based on an alternating magnetic field applied to the magnetic lamination exhibits no substantial hysteresis.

33. A magnetic lamination according to claim 32, wherein said giant magnetoresistive effect has a coercive force of less than 5 oersteds.

34. A magnetic lamination according to claim 32, wherein resistivity of said magnetic lamination to an applied magnetic field has a saturated value.

35. A magnetic lamination according to claim 32, wherein substantially stable directions of magnetization of adjacent magnetic films intersect at an angle in a range of from $0°$–$\pm 90°$.

36. A magnetic lamination according to claim 32, wherein the magnetic interaction between the magnetic films is alternately ferromagnetic and antiferromagnetic.

37. A magnetic lamination according to claim 25, wherein at least one magnetic film of said magnetic lamination comprises a magnetically hard film.

38. A magnetic lamination according to claim 37, wherein said at least one magnetically hard film comprises a composite film which comprises an antiferromagnetic film and a magnetically soft film.

39. A magnetic lamination according to claim 37, wherein said at least one magnetically hard film comprises a composite film which comprises a permanent magnet film and a magnetically soft film.

40. A magnetic lamination according to claim 37, wherein said at least one magnetically hard film is made of a ferrimagnetic material.

41. A magnetic lamination according to claim 21, wherein; the net magnetic moment of said magnetically hard film is smaller than said magnetically soft film; and substantially stable directions of magnetization of the hard and soft films intersect at an angle in a range of from $0°$–$\pm 90°$.

42. A magnetic lamination according to claim 41, wherein said magnetic lamination comprises a lamination of alternately superposed magnetically soft and hard films.

43. A magnetic lamination according to claim 41, wherein said magnetic lamination comprises at least one pair of magnetic films, each of said magnetic films comprising a first hard magnetic and a second soft magnetic film.

44. A magnetic lamination according to claim 19 or 20, wherein said magnetic lamination comprises at least two magnetically hard films, the value of the product of the thickness $t_{H1}$ and strength of magnetization $I_{H1}$ of a first of said at least two hard films is substantially equal to the value of the product of the thickness $t_{H2}$ and strength of magnetization $I_{H2}$ of a second hard film of said at least two films $t_{H1} \cdot I_{H1} \approx t_{H2} \cdot I_{H2}$.

45. A magnetic lamination according to claims 19 or 20, wherein a ratio $t_{M1} \cdot \rho_1 / t_{M2} \cdot \rho_2$ is 0.1–10, where $t_{M1}$ and $\rho_1$ are the thickness and resistivity, respectively, of the first magnetic film, and $t_{M2}$ and $\rho_2$ are the thickness and resistivity, respectively, of the second magnetic film.

46. A magnetic lamination according to claims 19 or 20, comprising a magnetic flux-magnetic field characteristic in which when an external magnetic field is applied to said magnetic lamination in the same direction as a signal magnetic field, said magnetic flux increases with said external magnetic field, and said magnetic lamination has a coercive force of less than 5 oersteds while when said external magnetic field increases in a direction at 180 degrees to the direction of the signal magnetic field, the magnetic flux-magnetic field characteristic differs from that in the same direction as the signal magnetic field.

47. A magnetic lamination according to claims 19 or 20, further including a metal diffusion preventive film provided on at least one of a magnetically soft film, a magnetically hard film, and an intermediate film disposed between said magnetically soft and hard films, said preventive film being made of at least one member selected from the group consisting of a nitride, carbide, sulfide, oxide, semi-metal and high-melting point metal.

48. A magnetic head adapted to face a magnetic recording medium for reading/writing data into/out of said recording medium, said magnetic head comprising a data read/write unit which in turn comprises a magnetic lamination according to any one of claims 1, 3, 5, 7 and 12.

49. A magnetic recording/reproducing device comprising:

means for driving a magnetic recording medium;

a magnetic head adapted to face said magnetic recording medium for reading/writing data into/out of the recording medium; and an electric circuit for sending/reading an electric signal corresponding to data to be read/written to/out of said magnetic head, said magnetic head comprising a data read/write unit which in turn comprises a magnetic lamination according to any one of claims 1, 3, 5, 7 and 12.

50. A magnetic head adapted to face a magnetic recording medium for reading/writing data into/out of the recording medium, such magnetic head comprising a data read/write unit which in turn comprises a magnetic lamination according to claims 19 and 41.

51. A magnetic recording/reproducing device comprising:

means for driving a magnetic recording medium;

a magnetic head adapted to face the magnetic recording medium for reading/writing data into/out of the recording medium; and an electric circuit for sending/reading an electric signal corresponding to data to be read/written to/out of the magnetic head, said magnetic head comprising a data read/write unit which in turn comprises a magnetic lamination according to claims 19 and 41.

* * * * *